(12) United States Patent
Ochi et al.

(10) Patent No.: US 11,765,941 B2
(45) Date of Patent: Sep. 19, 2023

(54) DISPLAY DEVICE

(71) Applicant: SHARP KABUSHIKI KAISHA, Sakai (JP)

(72) Inventors: Hisao Ochi, Sakai (JP); Tohru Senoo, Sakai (JP); Jumpei Takahashi, Sakai (JP); Tohru Sonoda, Sakai (JP); Takashi Ochi, Sakai (JP); Takeshi Hirase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 180 days.

(21) Appl. No.: 16/956,355

(22) PCT Filed: Dec. 26, 2017

(86) PCT No.: PCT/JP2017/046652
§ 371 (c)(1),
(2) Date: Jun. 19, 2020

(87) PCT Pub. No.: WO2019/130427
PCT Pub. Date: Jul. 4, 2019

(65) Prior Publication Data
US 2020/0335564 A1  Oct. 22, 2020

(51) Int. Cl.
*H10K 59/122* (2023.01)
*H10K 50/84* (2023.01)
*H10K 59/131* (2023.01)
*H10K 102/00* (2023.01)

(52) U.S. Cl.
CPC ......... *H10K 59/122* (2023.02); *H10K 50/841* (2023.02); *H10K 59/131* (2023.02); *H10K 2102/00* (2023.02)

(58) Field of Classification Search
CPC ............ H01L 51/5246; H01L 51/5253; H01L 27/3276; H01L 27/3246; H01L 27/3258; H01L 27/3279; H05B 33/12; H05B 33/22; H05B 33/02; H05B 33/04; H10K 2102/00; H10K 59/131; H10K 59/122; H10K 50/841; H10K 50/8426
See application file for complete search history.

(56) References Cited

U.S. PATENT DOCUMENTS

| | | | |
|---|---|---|---|
| 2012/0162053 A1* | 6/2012 | Lee | H10K 59/1315 345/80 |
| 2015/0041791 A1* | 2/2015 | Lee | H01L 27/1248 257/40 |
| 2016/0365398 A1* | 12/2016 | Kim | H10K 50/8426 |
| 2017/0033312 A1* | 2/2017 | Kim | H10K 59/131 |
| 2017/0077456 A1* | 3/2017 | Chung | H10K 50/846 |
| 2017/0279078 A1 | 9/2017 | Kamiya | |

(Continued)

FOREIGN PATENT DOCUMENTS

JP  2017-174607 A  9/2017

*Primary Examiner* — Vongsavanh Sengdara
(74) *Attorney, Agent, or Firm* — ScienBiziP, P.C.

(57) ABSTRACT

A display device includes: a display including a plurality of light-emitting devices; a first bank provided outside the display; a second bank provided outside the first bank; and a plurality of peripheral lines formed below, and intersecting with, the first bank and the second bank, wherein each of the peripheral lines includes a plurality of bends provided between the first bank and the second bank in plan view.

14 Claims, 14 Drawing Sheets

(56) References Cited

U.S. PATENT DOCUMENTS

| | | | | |
|---|---|---|---|---|
| 2017/0287995 A1* | 10/2017 | Kim | .................... | H10K 50/844 |
| 2017/0345847 A1* | 11/2017 | Kim | .................... | H01L 27/1222 |
| 2017/0373128 A1* | 12/2017 | Lee | .................... | H10K 59/131 |
| 2018/0013092 A1* | 1/2018 | Park | .................... | H10K 50/8426 |
| 2018/0108867 A1* | 4/2018 | Lee | .................... | H10K 59/131 |
| 2018/0124933 A1* | 5/2018 | Park | .................... | H10K 59/00 |
| 2018/0166525 A1* | 6/2018 | Kim | .................... | H10K 59/131 |

* cited by examiner

DISPLAY DEVICE

TECHNICAL FIELD

The present invention relates to a display device.

BACKGROUND ART

Patent Document 1 discloses a technique which involves applying a sealing material by an inkjet technique to a substrate including a light-emitting device.

CITATION LIST

Patent Literature

[Patent Document 1] Japanese Unexamined Patent Application Publication No. 2017-174607 (published on Sep. 28, 2017)

SUMMARY OF INVENTION

Technical Problem

When a technique such as an inkjet technique is used to form a sealing film up to a predetermined position of a frame area surrounding a display area, droplets created by the inkjet technique could flow outside along bumps between peripheral lines of the frame area. These droplets might flow over a predetermined position.

Solution to Problem

A display device according to an aspect of the present invention includes: a display including a plurality of light-emitting devices; a first bank provided outside the display; a second bank provided outside the first bank; and a plurality of peripheral lines formed below, and intersecting with, the first bank and the second bank, wherein each of the peripheral lines includes a plurality of bends provided between the first bank and the second bank in plan view.

Advantageous Effects of Invention

An aspect of the present invention reduce the risk that a sealing layer formed above a peripheral line exceeds a second bank.

BRIEF DESCRIPTION OF DRAWINGS

FIG. 4(*b*) is a cross-section taken from line b-b of FIG. 4(*a*). FIG. 4(*c*) is a cross-section illustrating an advantageous effect of the first embodiment.

FIG. 5(*a*) is a plan view. FIG. 5(*b*) is a cross-section taken from line b-b of FIG. 5(*a*).

FIG. 6(*a*) is a plan view. FIG. 6(*b*) is a cross-section taken from line b-b of FIG. 6(*a*).

FIG. 7(*a*) is a plan view illustrating a configuration example of the display device. FIG. 7(*b*) is a plan view illustrating a configuration example of an area XC which is a portion of a frame area. FIG. 7(*c*) is a cross-section taken from line c-c of FIG. 7(*b*).

FIG. 8(*b*) is a cross-section taken from line b-b of FIG. 8(*a*). FIG. 8(*c*) is a cross-section illustrating an advantageous effect of the second embodiment.

FIG. 9(*a*) is a plan view illustrating a configuration example of the display device. FIG. 9(*b*) is a plan view illustrating a configuration example of the area XC which is a portion of a frame area. FIG. 9(*c*) is a cross-section taken from line c-c of FIG. 9(*b*).

FIG. 10(*b*) is a cross-section taken from line b-b of FIG. 10(*a*). FIG. 10(*c*) is a cross-section taken from line c-c of FIG. 10(*a*).

FIG. 11(*b*) is a cross-section taken from line b-b of FIG. 11(*a*). FIG. 11(*c*) is a cross-section taken from line c-c of FIG. 11(*a*).

FIG. 12(*a*) is a plan view. FIG. 12(*b*) is a cross-section taken from line b-b of FIG. 12(*a*).

FIG. 13(*a*) is a plan view. FIG. 13(*b*) is a cross-section taken from line b-b of FIG. 13(*a*).

FIG. 14(*a*) is a plan view illustrating a configuration example of the display device. FIG. 14(*b*) is a plan view illustrating a configuration example of the area XC which is a portion of a frame area. FIG. 14(*c*) is a cross-section taken from line c-c of FIG. 14(*b*).

DESCRIPTION OF EMBODIMENTS

In the description below, the term "same layer" means that constituent features are formed in the same process (in the same film forming process). The term "lower layer (or layer below)" means that a constituent feature is formed in a previous process before a comparative layer. The term "upper layer (or layer above)" means that a constituent feature is formed in a successive process after a comparative layer.

Figure 1:
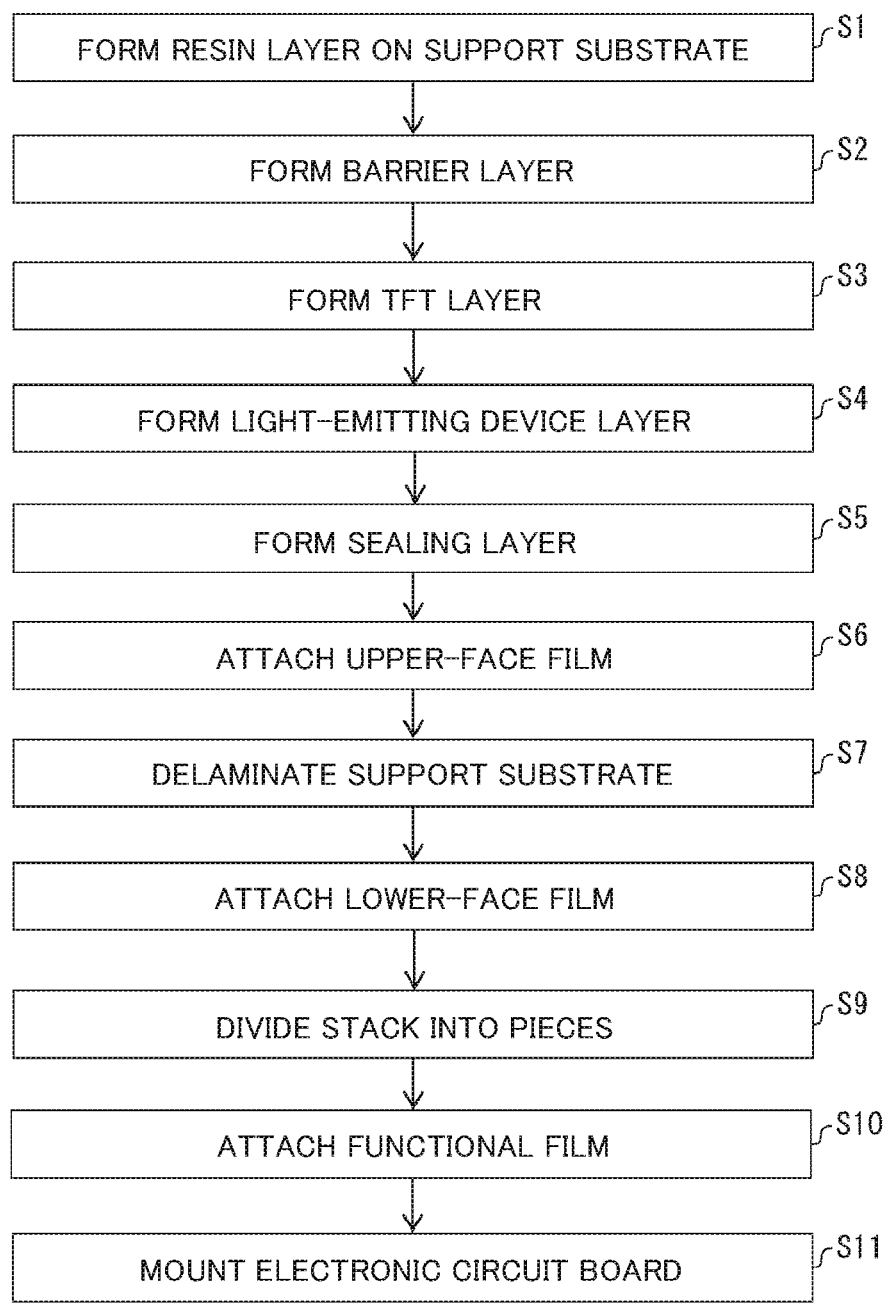
FIG. 1 is a flowchart illustrating an example of a method for producing a display device.
Figure 2:
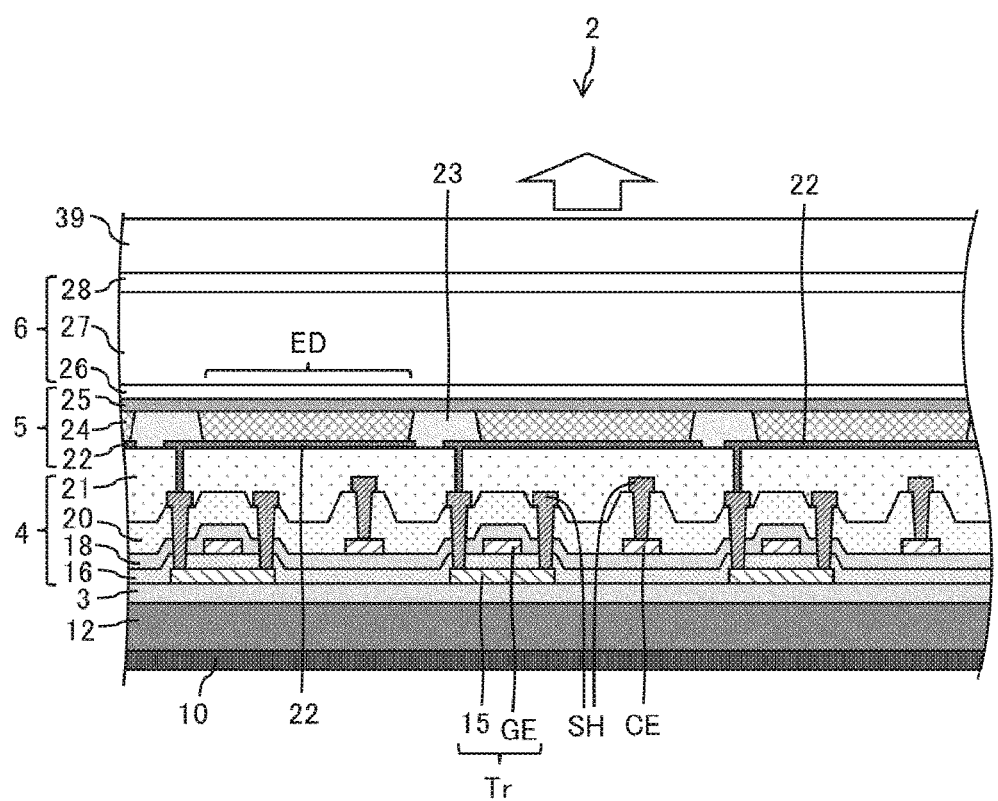
FIG. 2 is a cross-section illustrating a configuration example of a display of the display device.
Figure 3:
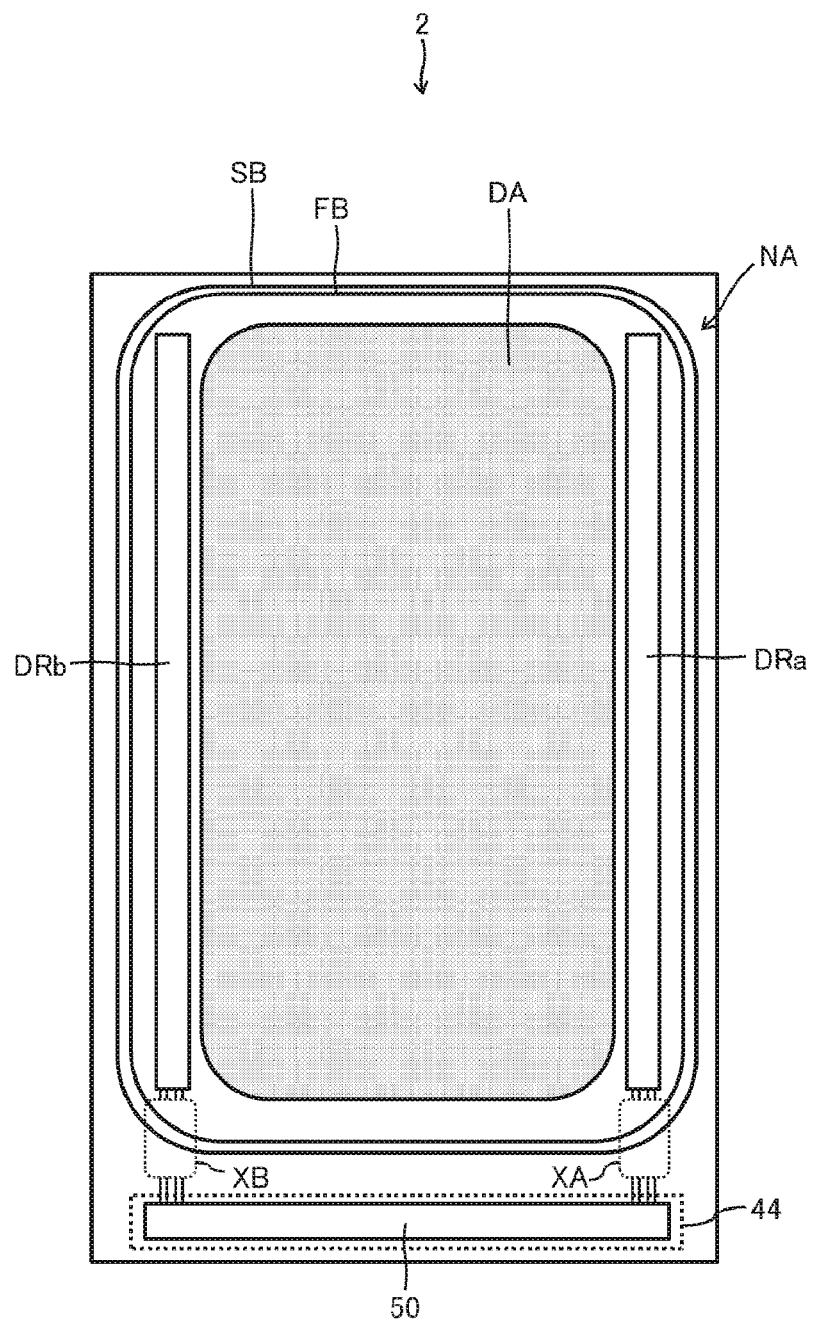
FIG. 3 is a plan view illustrating a configuration example of the display device.

FIG. 1 is a flow chart illustrating an example of a method for producing a display device. FIG. 2 is a cross-section illustrating a display of the display device. FIG. 3 is a plan view illustrating a configuration of the display device.

In producing a flexible display device, first, as illustrated in FIGS. 1 to 3, a resin layer 12 is formed on a translucent support substrate (e.g., a mother glass) (Step S1). Next, a barrier layer 3 is formed (Step S2). Next, a thin-film transistor (TFT) layer 4 is formed (Step S3). Next, a light-emitting device layer 5 of a top emission type (e.g., an organic electro-luminescent diode device layer, or an OLED layer) is formed (Step S4). Next, a sealing layer 6 is formed (Step S5). Next, on the sealing layer 6, an upper-face film is attached (Step S6).

Then, a laser beam is emitted to a lower face of the resin layer 12 through the support substrate to reduce binding between the support substrate and the resin layer 12, such that the support substrate is delaminated from the resin layer 12 (Step S7). Next, on the lower face of the resin layer 12, a lower-face film 10 is attached (Step S8). Next, a stack including the lower-face film 10, the resin layer 12, the barrier layer 3, the TFT layer 4, the light-emitting device layer 5, and the sealing layer 6 is divided into a plurality of pieces (Step S9). Next, to each of the obtained pieces, a functional film 39 is attached (Step S10). Next, an electronic circuit board (e.g., an IC chip) 50 is mounted on a terminal 44 provided in a frame area NA outside a display DA (see FIG. 3). Note that each of the above steps is executed by a display device production apparatus to be described later.

The resin layer 12 is made of, for example, polyimide. The lower-face film 10 is made of, for example, polyethylene terephthalate (PET).

The barrier layer 3 prevents such foreign objects as water and oxygen from reaching the TFT layer 4 and the light-emitting device layer 5. An example of the barrier layer 3 includes a silicon oxide film, a silicon nitride film, or a silicon oxide nitride film formed by the chemical-vapor deposition (CVD), or a multilayer film including those films.

The TFT layer 4 includes: a semiconductor film 15; an inorganic insulating film 16 (a gate insulating film) 16 above the semiconductor film 15; a gate electrode GE above the inorganic insulating film 16; an inorganic insulating film 18 above the gate electrode GE; a capacitance line CE above the inorganic insulating film 18; an inorganic insulating film 20 above the capacitance line CE; a source line SH above the inorganic insulating film 20; and a planarization film 21 (an inter-layer insulating film) above the source line SH.

As illustrated in FIG. 3, the frame area NA surrounding the display DA is provided with driver circuits DRa and DRb, and the terminal 44. The terminal 44 and the driver circuits DRa are connected together through a peripheral line included in an area XA (to be described later). The terminal 44 and the driver circuits DRb are connected together through a peripheral line included in an area XB. The driver circuits DRa and DRb may be monolithic circuits fabricated in the TFT layer 4.

The semiconductor film 15 is formed of, for example, low-temperature polysilicon (LTPS) or an oxide semiconductor. A thin-film transistor (TFT) Tr is formed to include the semiconductor film 15, the inorganic insulating film 16, and the gate electrode GE. In FIG. 2, the TFT Tr is illustrated as a top-gate TFT. Alternatively, the TFT Tr may be a bottom-gate TFT.

The gate electrode GE, the capacitance electrode CE, the source line SH, and a peripheral line TW are each formed of a metal monolayer film or a metal multilayer film including at least one of aluminum (Al), tungsten (W), molybdenum (Mo), tantalum (Ta), titanium (Ti), chromium (Cr), or copper (Cu).

The inorganic insulating films 16, 18, and 20 can be, for example, a silicon oxide (SiOx) film, or a silicon nitride (SiNx) film formed by the CVD, or a multilayer film including these films.

The planarization film 21 may be made of an applicable photosensitive organic material such as polyimide and acrylic. As illustrated in FIG. 3, the frame area NA is provided with: a first bank FB surrounding the display DA and the driver circuits DRa and DRb each disposed on either side of the display DA; and a second bank DB surrounding the first bank FB. The first bank FB and the second bank SB are formed in the same layer (in the same process) as, for example, the planarization film 21.

The light-emitting device layer 5 (e.g., an organic light-emitting diode layer) includes: an anode 22 above the planarization film 21; an anode cover film 23 having insulation and covering an edge of the anode 22; an electroluminescence (EL) layer 24 above the anode 22; and a cathode 25 above the EL layer 24. For each of the sub pixels, the light-emitting device 5 includes: a light-emitting device ED (e.g., an organic light-emitting diode (OLED) including the anode 22 shaped into an island, the EL layer 24, and the cathode 25; and a sub pixel circuit to drive the light emitting device ED. The anode cover film 23 may be made of an applicable photosensitive organic material such as polyimide and acrylic.

The EL layer 24 can be formed of a hole-injection layer, a hole-transport layer, a light-emitting layer, an electron-transport layer, and an electron-injection layer stacked on top of another in the stated order from the bottom. The light-emitting layer is shaped into an island for each sub pixel by vapor deposition or an ink-jet technique. The other layers are shaped into islands or a monolithic form. Moreover, the EL layer 24 may omit one or more of the hole-injection layer, the hole-transport layer, the electron-transport layer, and the electron-injection layer.

The anode (a positive electrode) 22 is formed of, for example, indium tin oxide (ITO), and silver (Ag) or an alloy including Ag stacked on top of each other. The anode 22 reflects light. The cathode 25 can be formed of a translucent conductive material such as an MgAg alloy (an ultra-thin film), ITO, and indium zinc oxide (IZO).

If the light-emitting device layer 5 is an OLED layer, a drive current between the anode 22 and the cathode 25 recombines holes and electrons together in the EL layer 24. The recombination forms an exciton which falls to the ground state, thereby emitting light. Since the cathode 25 is translucent and the anode 22 is light-reflective, the light emitted from the EL layer 24 travels upward. This is how the light-emitting device layer 5 is of a top emission type.

The light-emitting device layer 5 does not have to be limited to include an OLED device. Alternatively, the light-emitting device layer 5 may include an inorganic light-emitting diode or a quantum-dot light-emitting diode.

The sealing layer 6 is translucent, and includes: an inorganic sealing film 26 covering the cathode 25; an organic sealing film 27 above the inorganic sealing film 26; and an inorganic sealing film 28 above the organic sealing film 27. The sealing layer 6 covering the light-emitting device layer 5 prevents such foreign objects as water and oxygen from penetrating into the light-emitting device layer 5.

An example of the inorganic sealing films 26 and 28 includes a silicon oxide film, a silicon nitride film, or a silicon oxide nitride film formed by the CVD, or a multilayer film including those films. The organic sealing film 27 is a translucent organic film providing a planarized face. The organic sealing film 27 may be made of an applicable organic material such as acrylic.

The lower-face film 10 is attached to the lower face of the resin layer 12 after the support substrate is delaminated, so that the display device is provided with excellent flexibility. The lower-face film 10 is made of, for example, polyethylene terephthalate (PET). The functional film 39 has such functions as optical compensation, touch sensing, and protection.

Described above is how to produce a flexible display device. If the display device to be produced is inflexible, such steps as replacing substrates are not necessary. Hence, in FIG. 1, the production proceeds from Step S5 to Step S9.

First Embodiment

FIG. 4(a) is a plan view illustrating a configuration example of the area XA which is a portion of a frame area.

Figure 4:
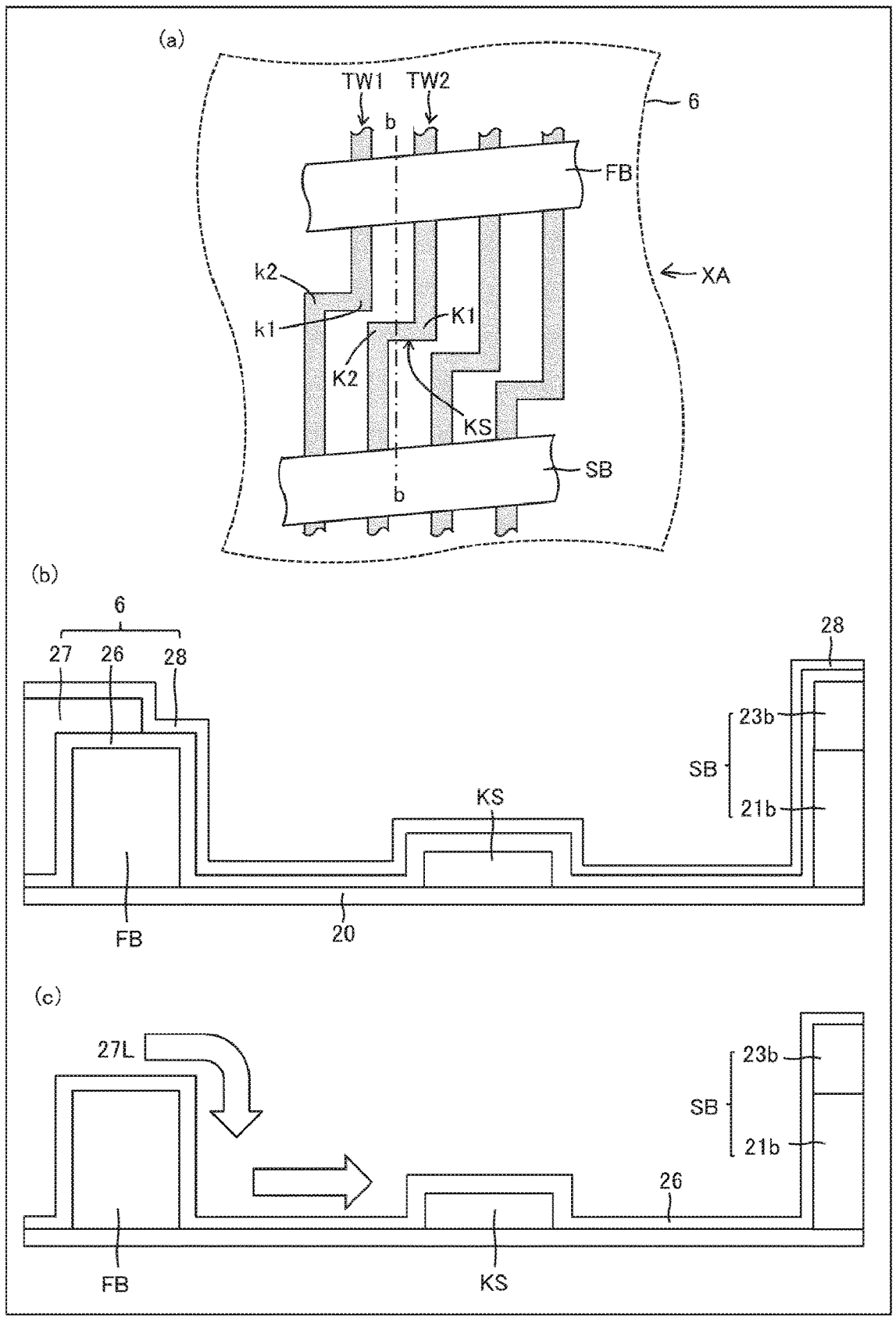
FIG. 4(*a*) is a plan view illustrating a configuration example of an area XA in a first embodiment.

FIG. 4(b) is a cross-section taken from line b-b of FIG. 4(a). FIG. 4(c) is a cross-section illustrating an advantageous effect of the first embodiment. In FIG. 4, the functional film 39 is omitted.

As illustrated in FIGS. 3 and 4, the area XA of the display device 2 includes: the first bank FB provided outside the display DA; the second bank SB provided outside the first bank FB; a plurality of peripheral lines TW1 and TW2 formed below, and intersecting with, the first bank FB and the second bank SB; the inorganic sealing film 26 covering the first bank FB, the second bank SB, and the peripheral lines TW1 and TW2; the organic sealing film 27 above the inorganic sealing film 26; and the inorganic sealing film 28 covering the organic sealing film 27.

The first bank FB is formed in the same layer as the planarization film 21. The second bank SB includes: a lower portion 21b formed in the same layer as the planarization film 21; and an upper portion 23b formed in the same layer as the anode cover film 23. The second bank SB provided outside is formed thicker (higher) than the first bank FB. Note that the peripheral lines TW1 and TW2 are formed in a source layer (in the same layer as the source line SH in FIG. 2).

The first bank FB is a preliminary barrier to block a droplet to be formed when the organic sealing film 27 is applied by an inkjet technique. The second bank SB is a subsequent barrier to block the droplet flowing over the second bank SB. As illustrated in FIG. 3, each of the first bank FB and the second bank SB is shaped overall into a frame surrounding the display DA, and has a corner with a curvature. In plan view, the peripheral lines TW1 and TW2 each intersect with the corners of the first bank FB and the second bank SB. In FIG. 4, the corners, of the first bank FB and the second bank SB, having the curvature are illustrated linearly.

The peripheral line TW1 includes a plurality of bends k1 and k2 provided between the first bank FB and the second bank SB in plan view. The peripheral line TW1 turns 90 degrees at each of the bends k1 and k2. The peripheral line TW2 includes a plurality of bends K1 and K2 provided between the first bank FB and the second bank SB in plan view. The peripheral line TW2 turns 90 degrees at each of the bends K1 and K2. (A portion between the bends K1 and K2 is referred to as a turn KS.) The peripheral lines TW1 and TW2 are arranged side-by-side and shaped into cranks turning in the same direction (turning leftward in FIG. 4(a)).

In the first embodiment, even if a droplet 27L flows over the first bank FB and runs between the peripheral lines TW1 and TW2 when the organic sealing film 27 is applied by an inkjet technique as illustrated in FIG. 4(c), the turn KS of the peripheral line TW2 acts as a barrier. Such a feature reduces the risk that the droplet 27L flows over the second bank SB. In the first bank FB and the second bank SB shaped into a frame, the corners tend to be lower (than straight portions). Hence, it makes a significant sense to provide a turn acting as a barrier to the peripheral lines TW1 and TW2 intersecting with the corners.

Figure 5:
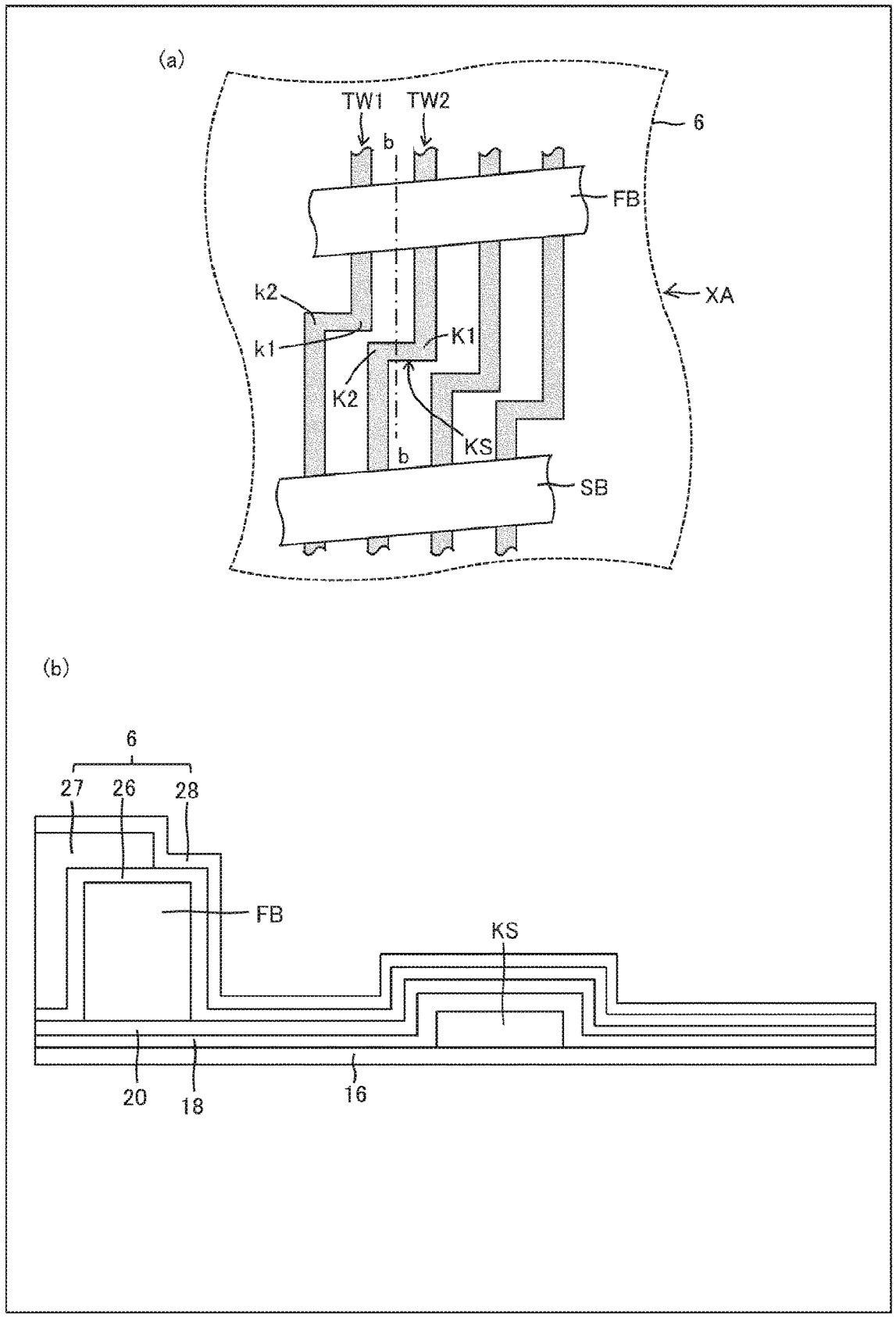
FIG. 5 illustrates a modification of the first embodiment.

FIG. 5 illustrates a modification of the first embodiment. FIG. 5(a) is a plan view illustrating a configuration example of the area XA. FIG. 5(b) is a cross-section taken from line b-b of FIG. 5(a). As illustrated in FIG. 5(b), the peripheral lines TW1 and TW2 can be formed in the gate layer (in the same layer as the gate electrode GE in FIG. 2).

Figure 6:
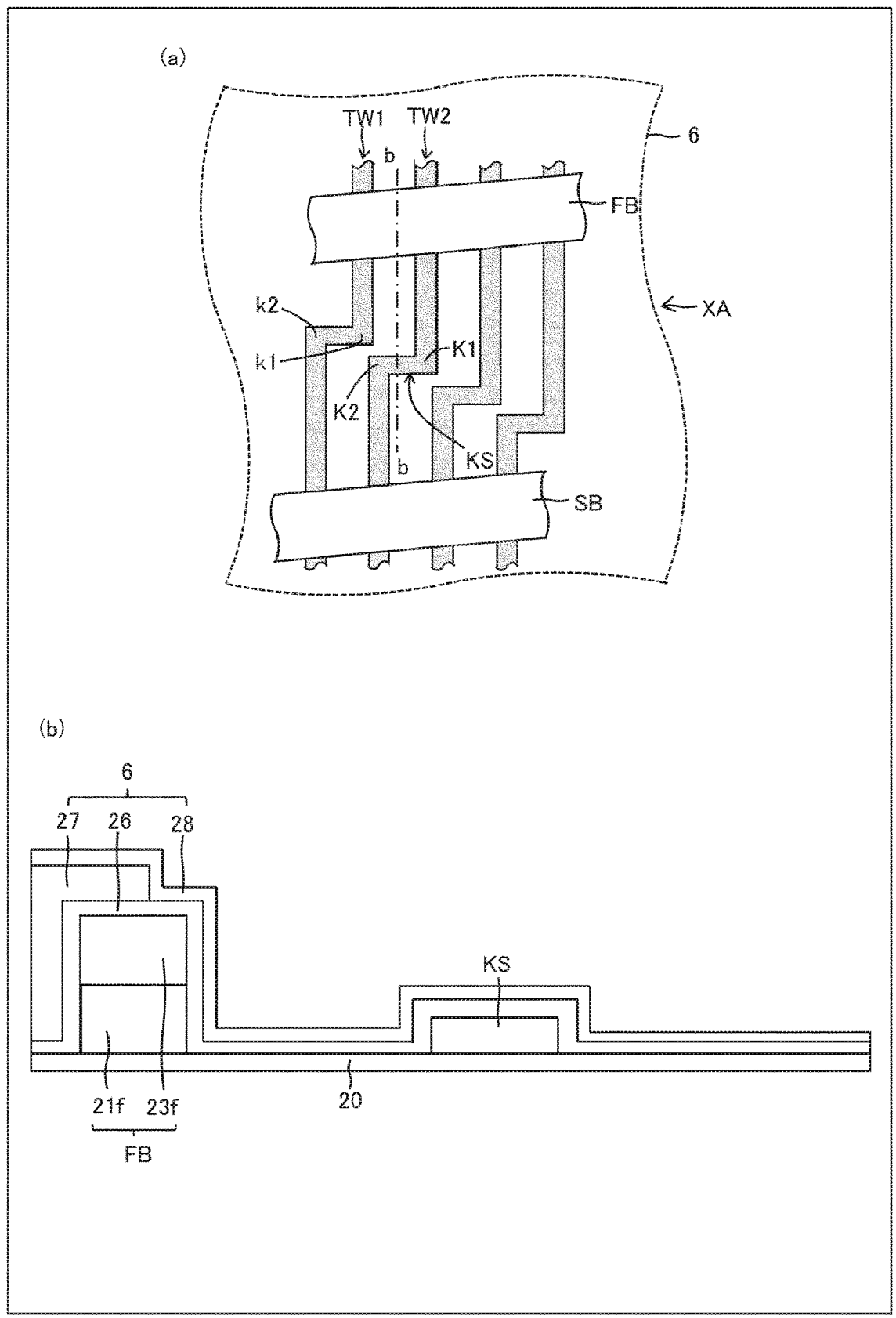
FIG. 6 illustrates another modification of the first embodiment.

FIG. 6 illustrates another modification of the first embodiment. FIG. 6(a) is a plan view illustrating a configuration example of the area XA. FIG. 6(b) is a cross-section taken from line b-b of FIG. 6(a). As illustrated in FIG. 6(b), each of the first bank FB and the second bank SB can include: a lower portion 21f formed in the same layer as the planarization film 21 is (see FIG. 2); and an upper portion 23f formed in the same layer as the anode cover film 23 (see FIG. 2).

Figure 7:
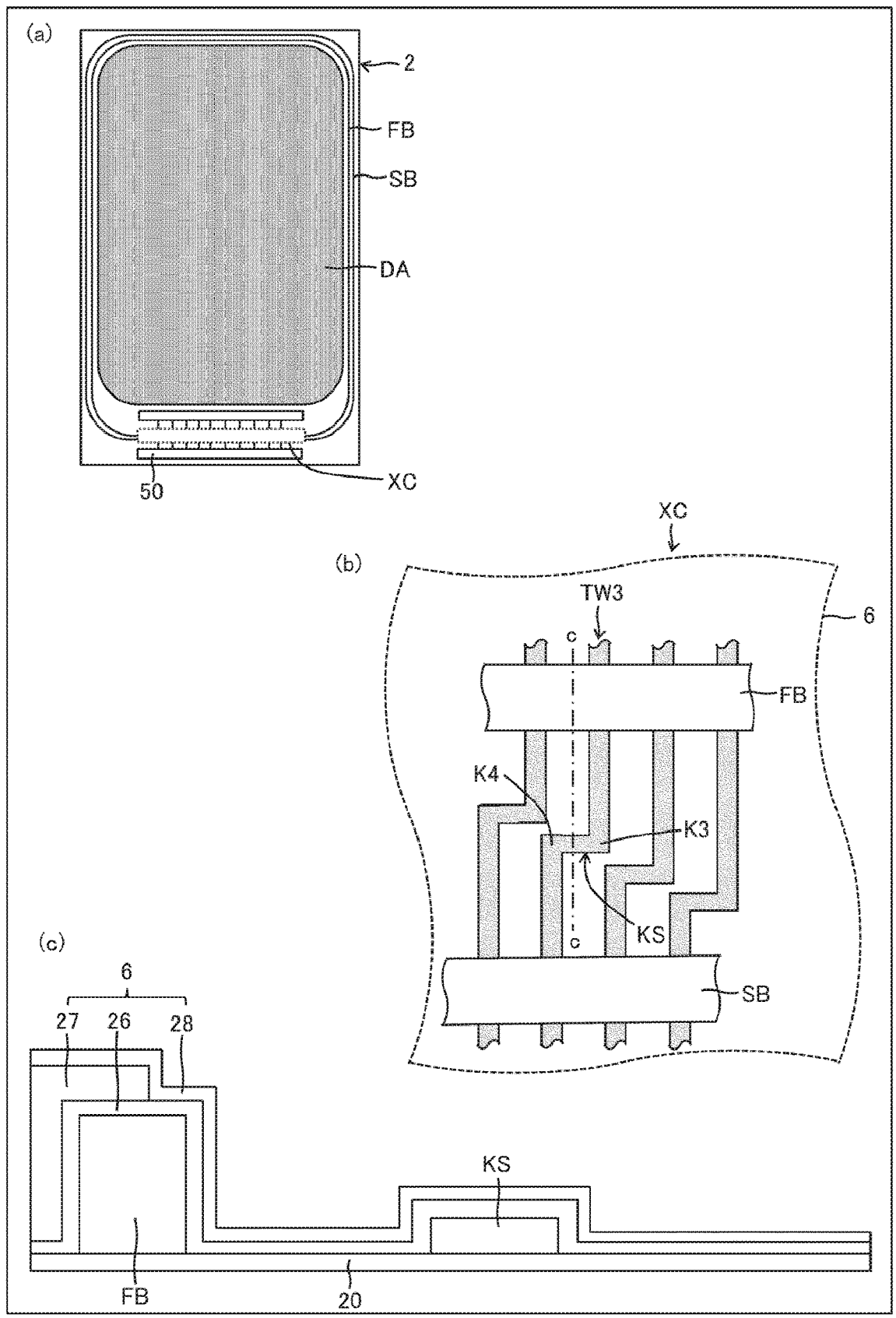
FIG. 7 illustrates still another modification of the first embodiment.

In the above embodiment, the peripheral lines intersect with, but not limited to, the corners of the first bank FB and the second bank SB. FIG. 7 illustrates still another modification of the first embodiment. FIG. 7(a) is a plan view illustrating a configuration example of the display device. FIG. 7(b) is a plan view illustrating a configuration example of an area XC which is a portion of a frame area. FIG. 7(c) is a cross-section taken from line c-c of FIG. 7(b). As illustrated in FIG. 7, when a periphery line TW3 intersects with a straight portion other than the corners of the first bank FB and the second bank SB, the periphery line TW3 may include a plurality of bends K3 and K4 positioned between the first bank FB and the second bank SB in plan view. (A portion between the bends K3 and K4 is referred to as the turn KS.)

Second Embodiment

Figure 8:
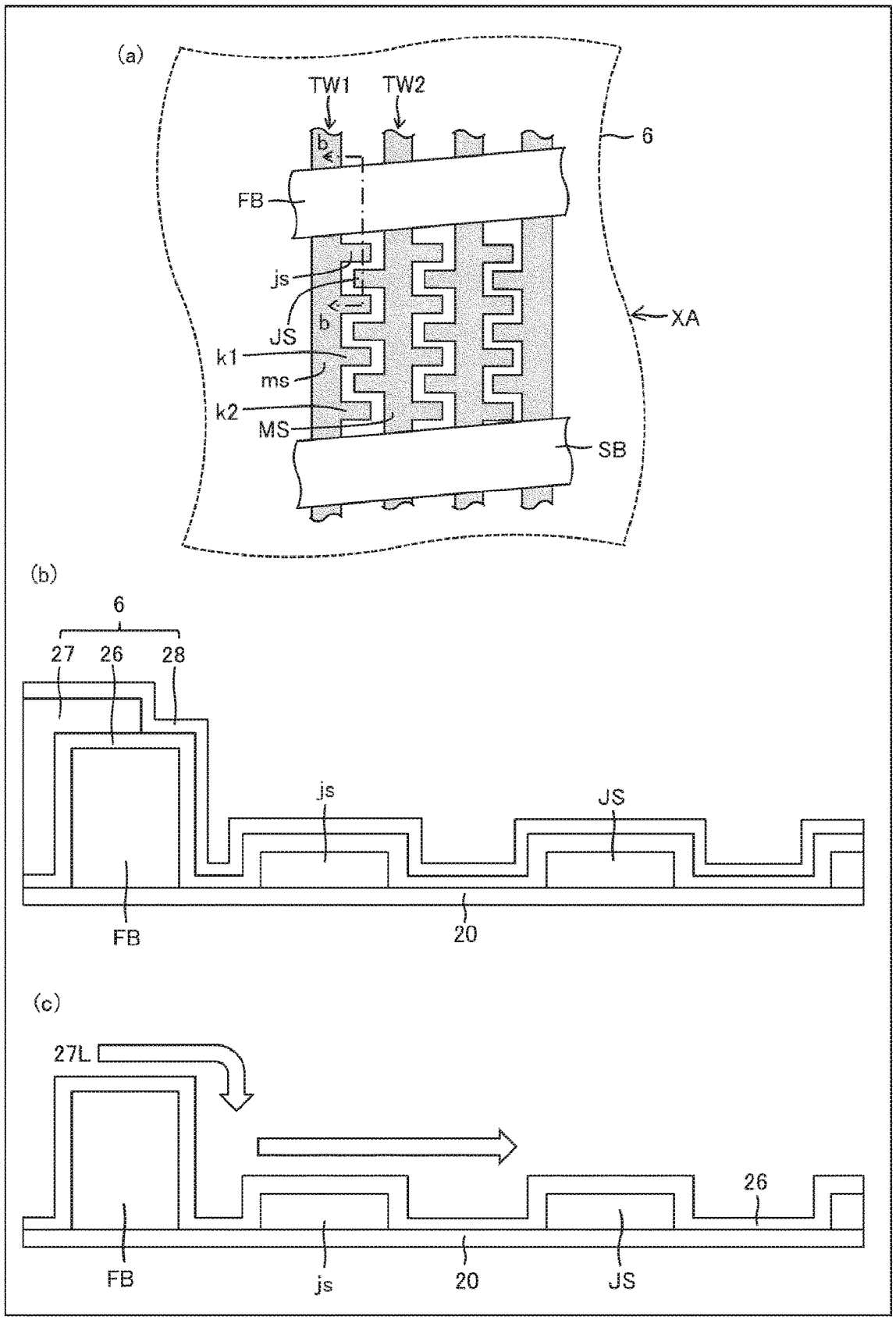
FIG. 8(*a*) is a plan view illustrating a configuration example of the area XA in a second embodiment.

FIG. 8(a) is a plan view illustrating a configuration example of the area XA which is a portion of a frame area. FIG. 8(b) is a cross-section taken from line b-b of FIG. 8(a). FIG. 8(c) is a cross-section illustrating an advantageous effect of a second embodiment. In FIG. 8, the functional film 39 is omitted.

As illustrated in FIGS. 3 and 8, the area XA of the display device 2 includes: the first bank FB provided outside the display DA; the second bank SB provided outside the first bank FB; the peripheral lines TW1 and TW2 formed below the first bank FB and the second bank SB, and intersecting with the first bank FB and the second bank SB in plan view; the inorganic sealing film 26 covering the first bank FB, the second bank SB, and the peripheral lines TW1 and TW2; the organic sealing film 27 above the inorganic sealing film 26; and the inorganic sealing film 28 covering the organic sealing film 27. The first bank FB and the second bank SB are formed in the same layer as the planarization film 21 is. The peripheral lines TW1 and TW2 are formed in the source layer.

The peripheral line TW1 includes: a trunk ms; and a branch js branching off the trunk ms. The trunk ms and the branch js are provided between the first bank FB and the second bank SB in plan view. The peripheral line TW2 includes: a trunk MS; and a branch JS branching off the trunk MS. The trunk MS and the branch JS are provided between the first FB and the second SB in plan view. Here, the two peripheral lines TW1 and TW2 are arranged side-by-side. The branch js of the peripheral line TW1 and the branch JS of the peripheral line TW2 are staggered not to short-circuit.

In the second embodiment, too, the peripheral line TW1 includes the bends k1 and k2 provided between the first bank FB and the second bank SB in plan view. The bends k1 and k2 are bases of a plurality of the branches js. Here, the bases are intersections of the trunk ms and the branches js.

In the second embodiment, even if the droplet 27L flows over the first bank FB and runs between the peripheral lines TW1 and TW2 when the organic sealing film 27 is applied by an inkjet technique as illustrated in FIG. 8(c), the branches js and JS act as barriers. Such a feature reduces the risk that the droplet 27L flows over the second bank SB. In the first bank FB and the second bank SB shaped into a frame, the corners tend to be lower (than straight portions).

Hence, it makes a significant sense to provide branches acting as barriers to the peripheral lines TW1 and TW2 intersecting with the corners. Moreover, the provided branches can reduce resistance of the peripheral lines.

In the second embodiment, too, the periphery lines TW1 and TW2 can be formed in the gate layer (in the same layer as the gate electrode GE in FIG. 2). Moreover, each of the first bank FB and the second bank SB can include: a lower portion formed in the same layer as the planarization film 21 (see FIG. 2); and an upper portion formed in the same layer as the anode cover film 23 (see FIG. 2).

Figure 9:
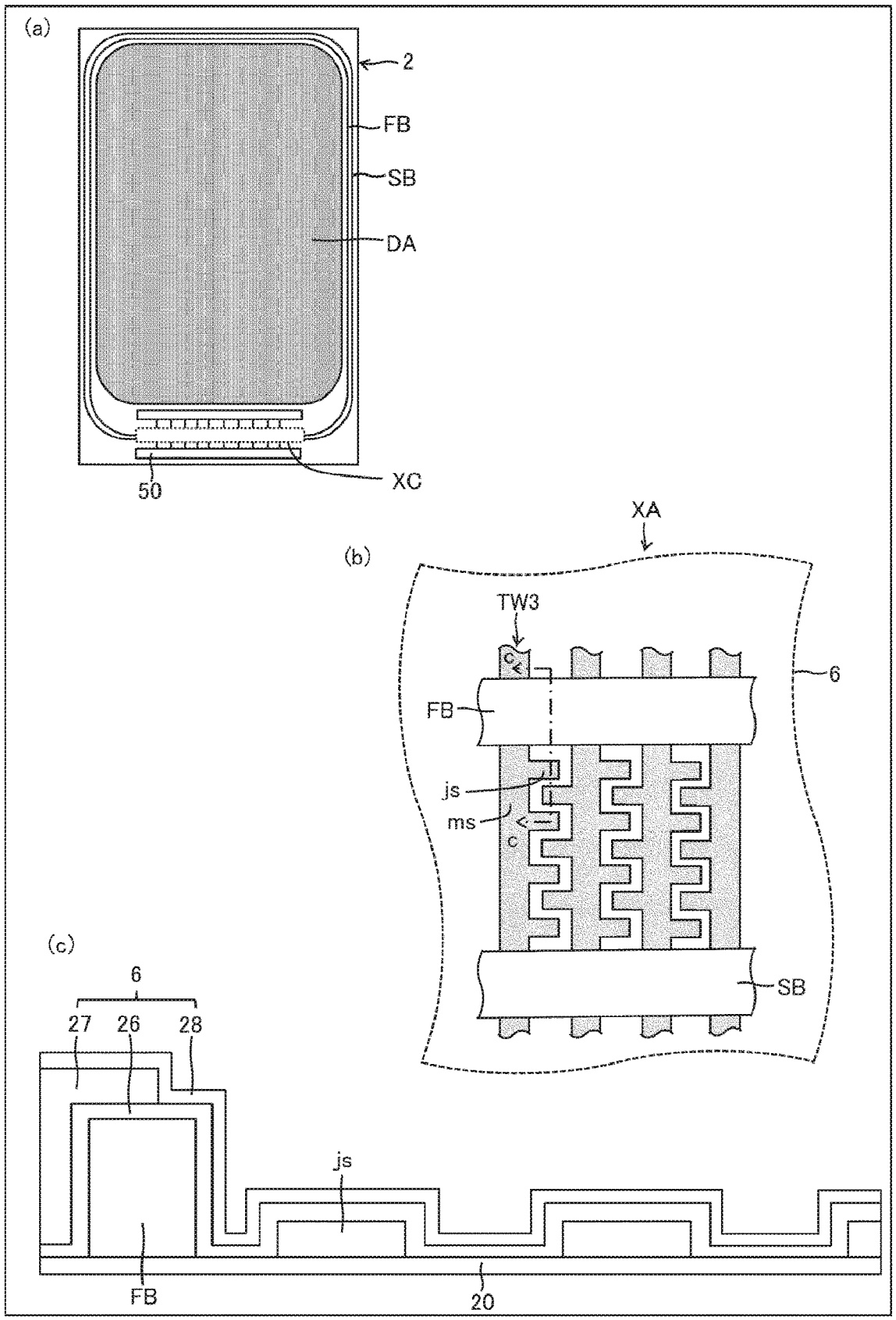
FIG. 9 illustrates another modification of the second embodiment.

FIG. 9 illustrates another modification of the second embodiment. FIG. 9(a) is a plan view illustrating a configuration example of the display device. FIG. 9(b) is a plan view illustrating a configuration example of the area XC which is a portion of a frame area. FIG. 9(c) is a cross-section taken from line c-c of FIG. 9(b). As illustrated in FIG. 9, when the periphery line TW3 intersects with a straight portion other than the corners of the first bank FB and the second bank SB, the periphery line TW3 may include the trunk ms and the branch js branching off the trunk ms. The trunk ms and the branch js are provided between the first bank FB and the second bank SB in plan view.

Third Embodiment

Figure 10:
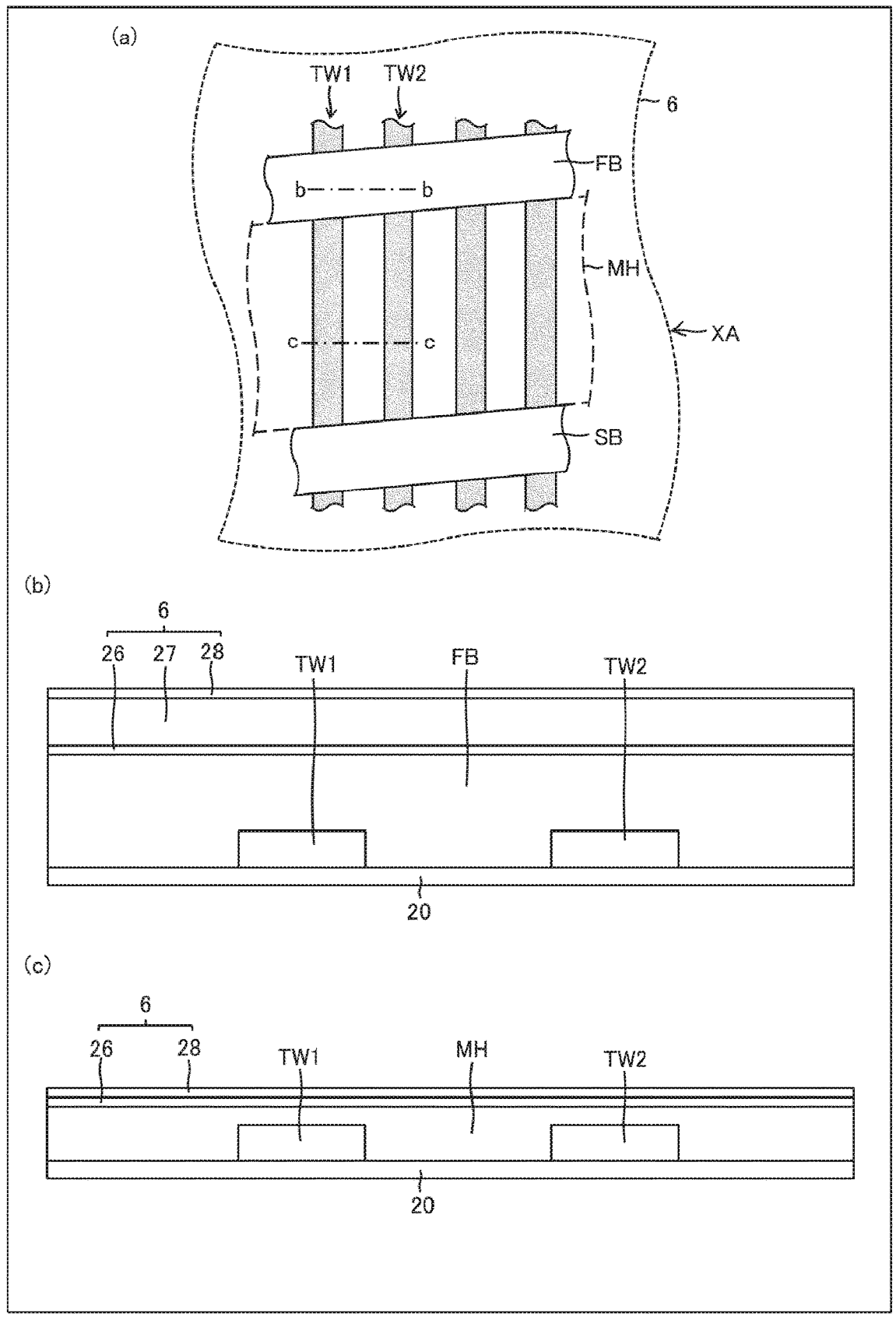
FIG. 10(*a*) is a plan view illustrating a configuration example of the area XA in a third embodiment.
Figure 11:
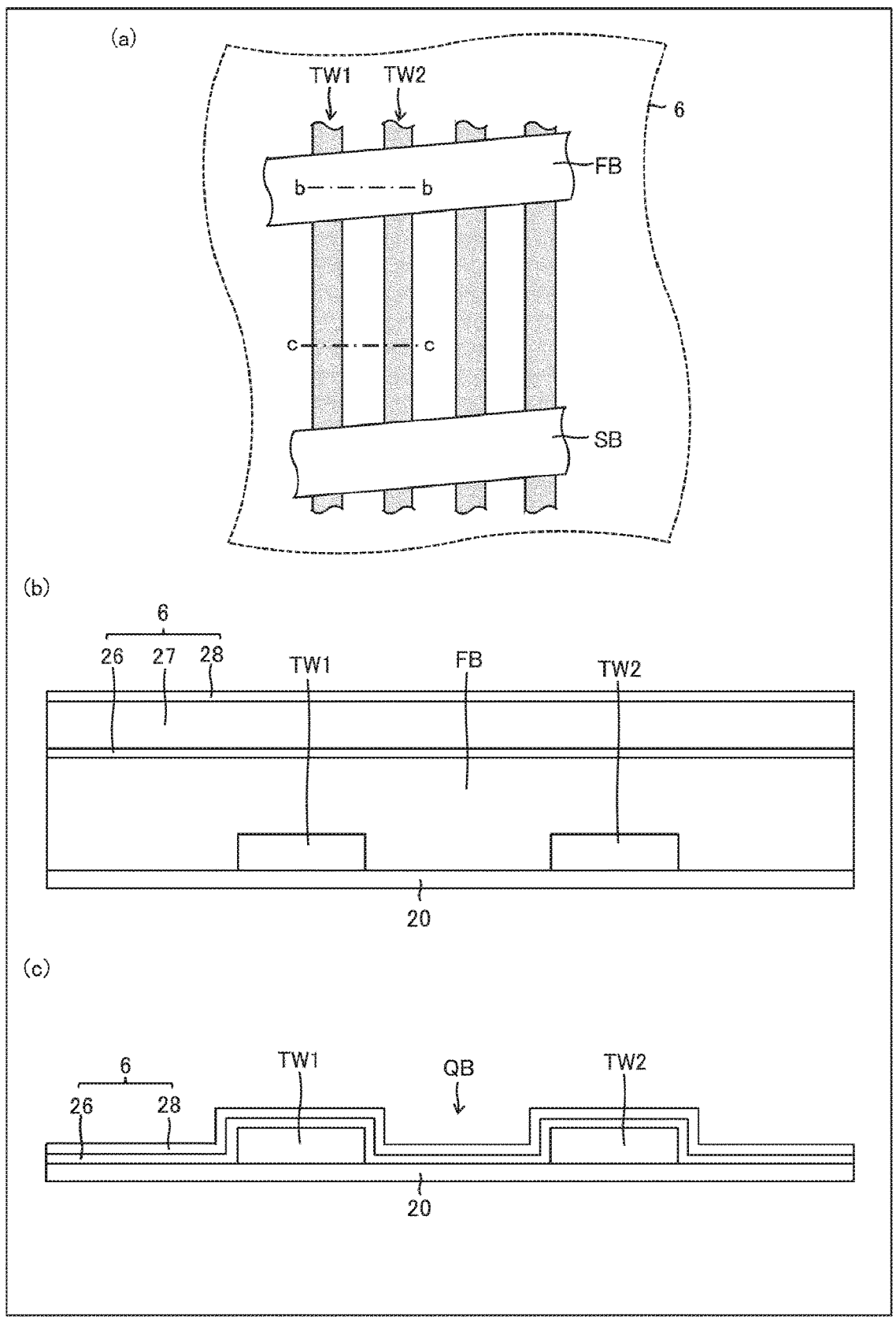
FIG. 11(*a*) is a plan view illustrating a reference example.

FIG. 10(a) is a plan view illustrating a configuration example of the area XA which is a portion of a frame area. FIG. 10(b) is a cross-section taken from line b-b of FIG. 10(a). FIG. 10(c) is a cross-section taken from line c-c of FIG. 10(a). In FIG. 10, the functional film 39 is omitted. FIG. 11(a) is a plan view illustrating a reference example. FIG. 11(b) is a cross-section taken from line b-b of FIG. 11(a). FIG. 11(c) is a cross-section taken from line c-c of FIG. 11(a).

As illustrated in FIGS. 3 and 10, the area XA of the display device 2 includes: the first bank FB provided outside the display DA; the second bank SB provided outside the first bank FB; the peripheral lines TW1 and TW2 formed below the first bank FB and the second bank SB, and intersecting with the first bank FB and the second bank SB in plan view; the inorganic sealing film 26 covering the first bank FB, the second bank SB, and the peripheral lines TW1 and TW2; the organic sealing film 27 above the inorganic sealing film 26; and the inorganic sealing film 28 covering the organic sealing film 27.

The first bank FB and the second bank SB are formed in the same layer as the planarization film 21. The peripheral lines TW1 and TW2 are formed in the source layer.

In the third embodiment, an inter-bank insulating film MH, which is thinner than the first bank FB, is provided between the first bank FB and the second bank SB and in the same layer as the planarization film 21. The inter-bank insulating film MH covers the peripheral lines TW1 and TW2. The inter-bank insulating film MH is thinner than the second bank SB and made of resin (i.e., made of the same material as the planarization film 21). The inter-bank film MH is formed between the first bank FB and the second bank SB without any gap.

Because of the inter-bank insulating film MH in the third embodiment, bumps between the peripheral lines TW1 and TW2 hardly appear on the surface of the inorganic sealing film 26. Thus, when the organic sealing film 27 is applied by an inkjet technique, such a feature reduces the risk that a droplet possibly flowing outside the first bank FB flows over the second bank SB. Note that, in the reference example in FIG. 11 without the inter-bank insulating film MH, a droplet might flow out of the first bank FB, through a recess QB between the peripheral lines TW1 and TW2, and over the second bank SB. In the first bank FB and the second bank SB shaped into a frame, the corners tend to be lower (than straight portions). Hence, it makes a significant sense to provide the inter-bank insulating film MH between the corners of the first bank FB and the second bank SB to fill the recess between the peripheral lines TW1 and TW2.

Figure 12:
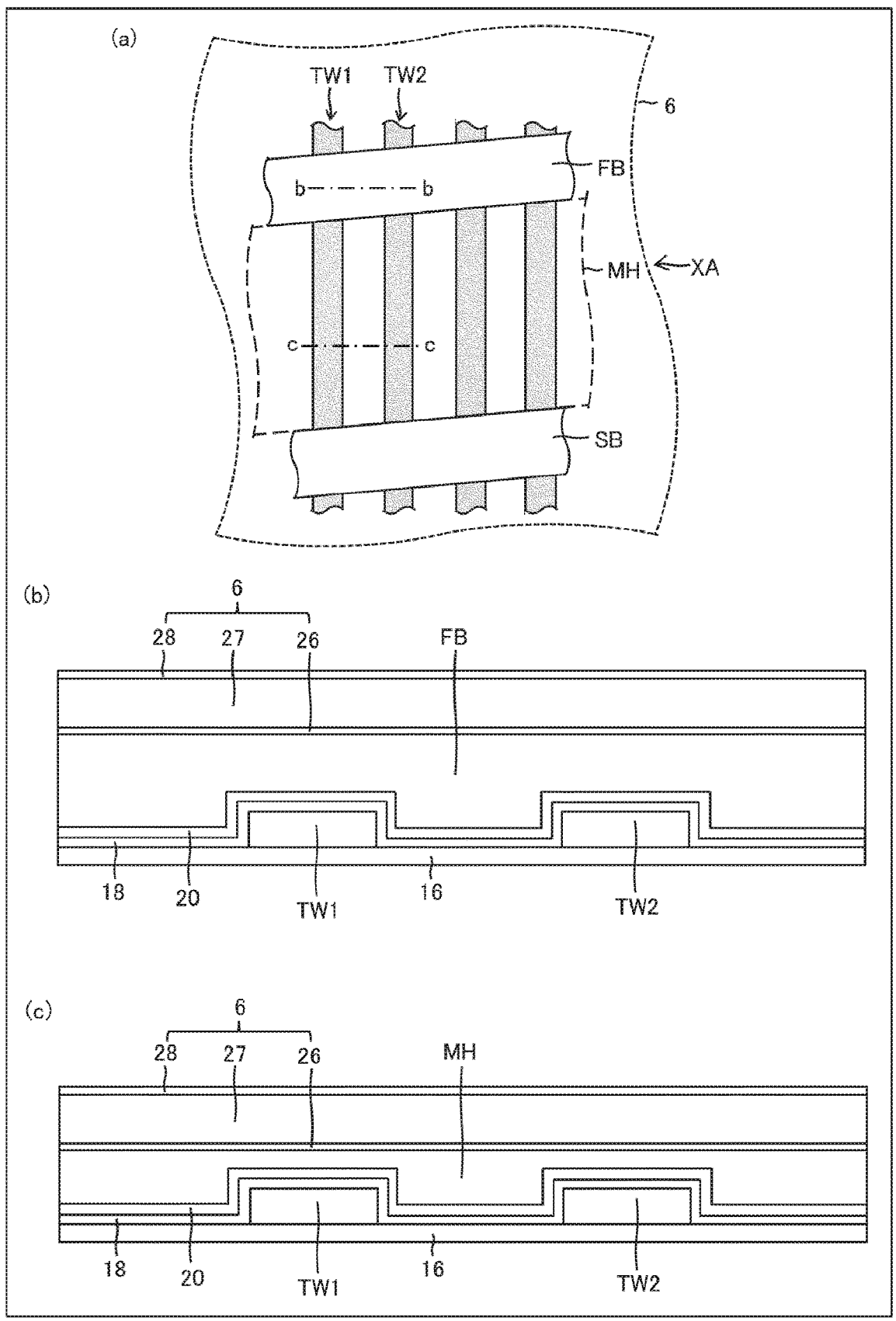
FIG. 12 illustrates a modification of the third embodiment.

FIG. 12 illustrates a modification of the third embodiment. FIG. 12(a) is a plan view illustrating a configuration example of the area XA. FIG. 12(b) is a cross-section taken from line b-b of FIG. 12(a). As illustrated in FIG. 12(b), the peripheral lines TW1 and TW2 can be formed in the gate layer (in the same layer as the gate electrode GE in FIG. 2).

Figure 13:
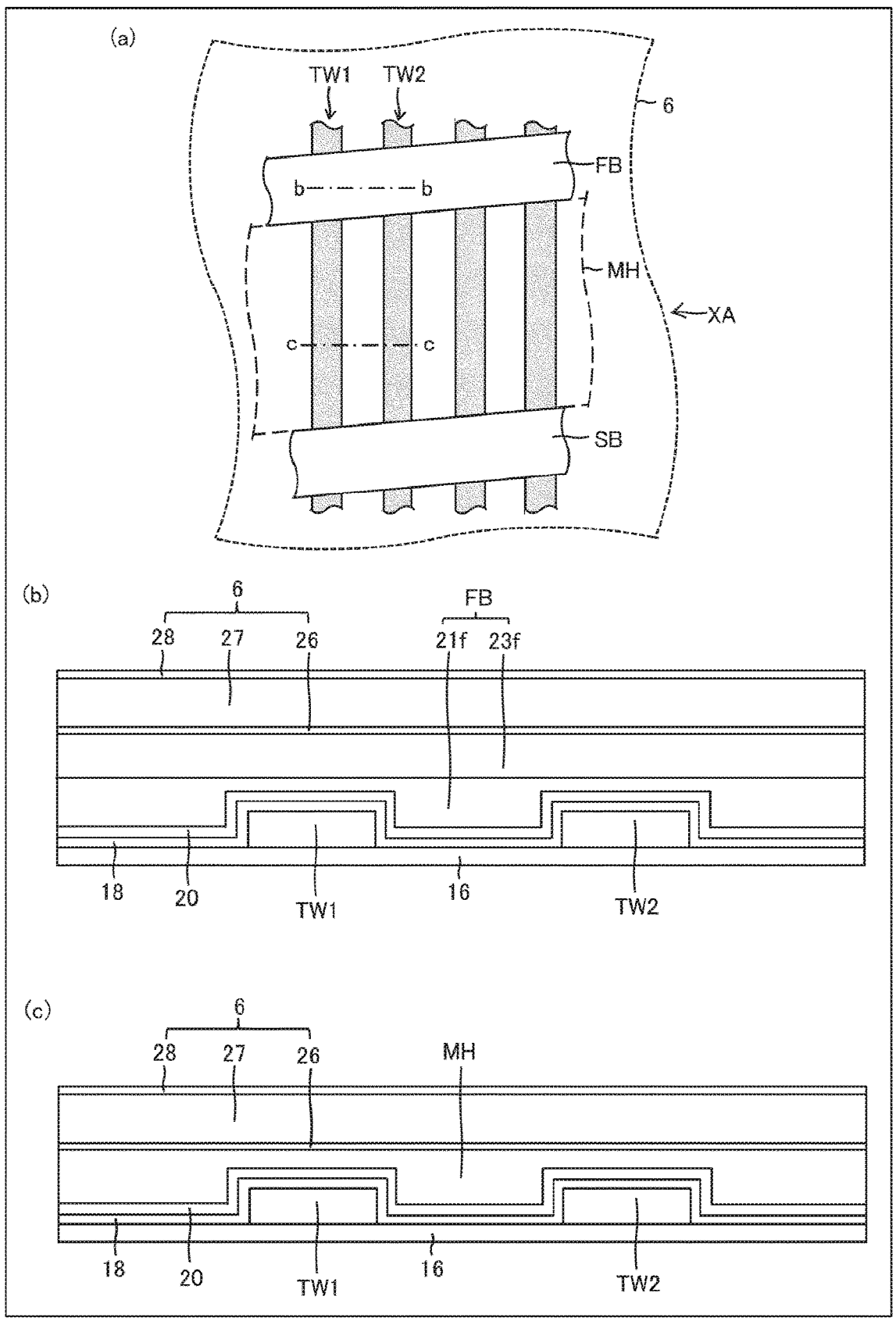
FIG. 13 illustrates still another modification of the third embodiment.

FIG. 13 illustrates still another modification of the third embodiment. FIG. 13(a) is a plan view illustrating a configuration example of the area XA. FIG. 13(b) is a cross-section taken from line b-b of FIG. 13(a). As illustrated in FIG. 13(b), each of the first bank FB and the second bank SB includes: the lower portion 21f formed in the same layer as the planarization film 21 (see FIG. 2); and the upper portion 23f formed in the same layer as the anode cover film 23 (see FIG. 2). The inter-bank insulating film MH may be formed in the same layer (in the same process) as the planarization film 21, or as the anode cover film 23.

Figure 14:
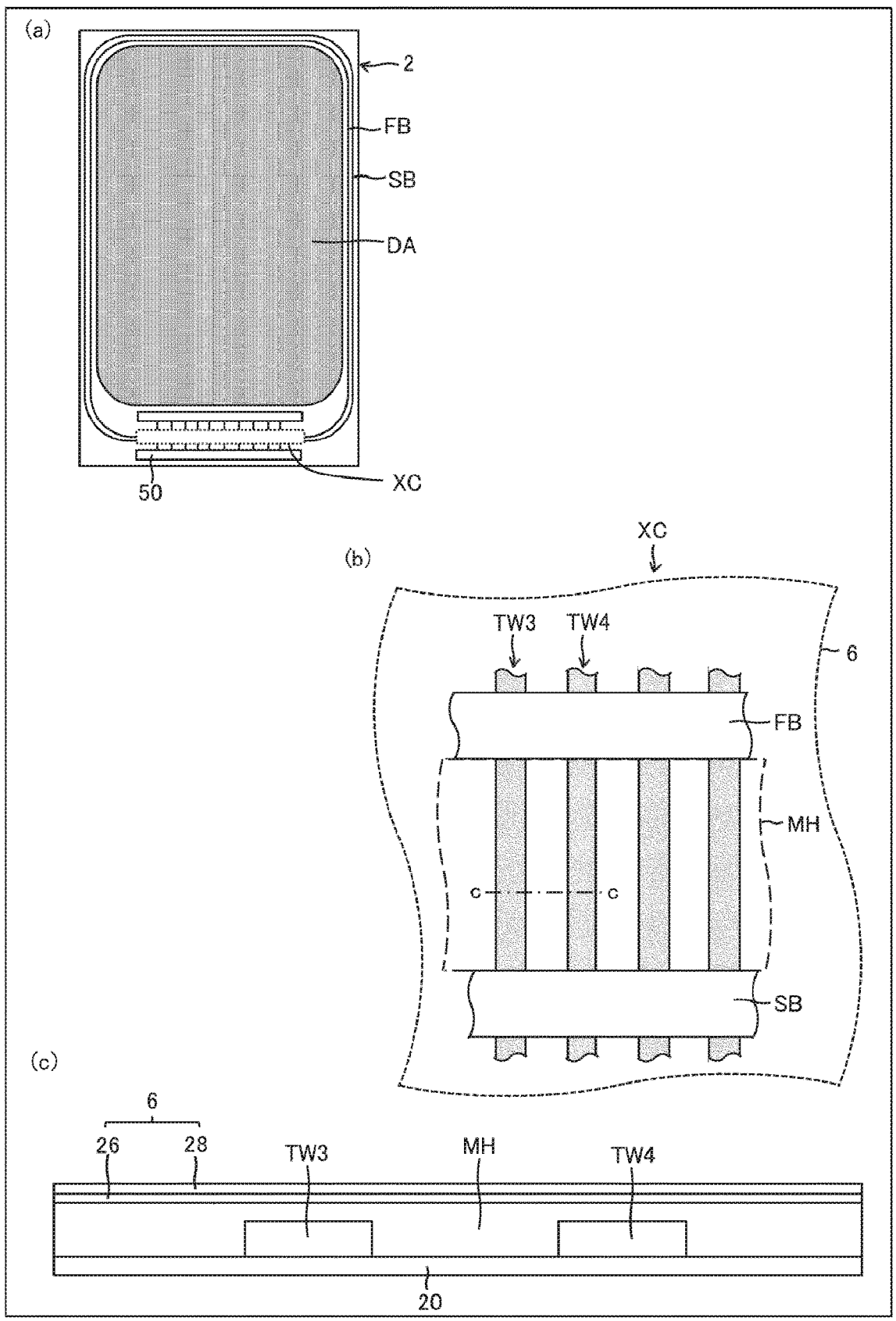
FIG. 14 illustrates still another modification of the third embodiment.

FIG. 14 illustrates still another modification of the third embodiment. FIG. 14(a) is a plan view illustrating a configuration example of the display device. FIG. 14(b) is a plan view illustrating a configuration example of the area XC which is a portion of a frame area. FIG. 14(c) is a cross-section taken from line c-c of FIG. 14(b). As illustrated in FIG. 14, when peripheral lines TW3 and TW4 intersect with a straight portion other than the corners of the first bank FB and the second bank SB, the inter-bank insulating film MH is provided between the first bank FB and the second bank SB and in the same layer as the planarization film 21. The inter-bank insulating film MH is thinner than the first bank FB, and covers the peripheral lines TW3 and TW4.

Summary

The electro-optical element (c.f., an electro-optical element whose brightness and transmittance are controlled by current) included in the display device according to the above embodiments is not limited to a particular one. Examples of the display device according to the above embodiments include: an organic electro-luminescence (EL) display including an OLED as an electro-optical element; an inorganic EL display including an inorganic light-emitting diode as an electro-optical element; and a quantum dot light-emitting-diode (QLED) display including a QLED as an electro-optical element.

First Aspect

A display includes a plurality of light-emitting devices; a first bank provided outside the display; a second bank provided outside the first bank; and a plurality of peripheral lines formed below, and intersecting with, the first bank and the second bank, wherein each of the peripheral lines includes a plurality of bends provided between the first bank and the second bank in plan view.

Second Aspect

The display device according to, for example, the first aspect, wherein each of the peripheral lines includes a portion shaped into a crank between the first bank and the second bank.

Third Aspect

The display device according to, for example, the first aspect, wherein each of the peripheral lines includes: a trunk; a branch branching off the trunk; and an intersection, of the trunk and the branch, including the bends, and the trunk and the branch are provided between the first bank and the second bank in plan view.

Fourth Aspect

The display device according to, for example, the third aspect, wherein the peripheral lines are arranged side-by-side, and the branch of one of the peripheral lines and the branch of another one of the peripheral lines are staggered.

Fifth Aspect

A display device including: a display; a first bank provided outside the display; a second bank provided outside the first bank; and a plurality of peripheral lines formed below, and intersecting with, the first bank and the second bank, the display device comprising
an inter-bank insulating film thinner than the first bank, provided between the first bank and the second bank, and covering the peripheral lines.

Sixth Aspect

The display device according to, for example, the fifth aspect, wherein the inter-bank insulating film is thinner than the second bank, made of resin, and formed between the first bank and the second bank to cover the peripheral lines without any gap.

Seventh Aspect

The display device according to, for example, any one of the first to sixth aspects, further comprising: a first inorganic sealing film covering the first bank and the second bank; an organic sealing film provided above the first inorganic sealing film; and a second inorganic sealing film covering the organic sealing film.

Eighth Aspect

The display device according to, for example, the first aspect, wherein each of the first bank and the second bank is shaped into a frame, and has a corner with a curvature, and
the peripheral lines include the bends between the corners of the first bank and the second bank in plan view.

Ninth Aspect

The display device according to, for example, the fifth aspect, wherein each of the first bank and the second bank is shaped into a frame and having a corner with a curvature, and
the inter-bank insulating film is provided between the corners of the first bank and the second bank in plan view to cover the peripheral lines.

Tenth Aspect

The display device according to, for example, any one of the first to ninth aspects, further comprising: a plurality of TFTs; and a planarization film provided above the plurality of TFTs and below the light-emitting devices, wherein
the peripheral lines are formed either (i) above a gate electrode of the TFTs and below the planarization film, or (ii) in the same layer as the gate electrode.

Eleventh Aspect

The display device according to, for example, the tenth aspect, wherein each of the first bank and the second bank is at least partially formed in the same layer as the planarization film.

REFERENCE SIGNS LIST

2 Display Device
3 Barrier Layer
4 TFT Layer
5 Light-Emitting Device Layer
6 Sealing Layer
12 Resin Layer
16, 18, 20 Inorganic Insulating Film
21 Planarization Film
23 Anode Cover Film
24 EL Layer
26, 28 Inorganic Sealing Film
27 Organic Sealing Film
44 Terminal
DA Display
ED Light-Emitting Device
TW1, TW2 Peripheral Line
FB First Bank
SB Second Bank
MS, ms Trunk
JS, js Branch
MH Inter-Bank Insulating Film
k1, k2, K1, K2 Bend

The invention claimed is:

1. A display device comprising: a display including a plurality of light-emitting devices forming a display region; a first bank spaced apart from the display region so as to surround the display region in a plan view; a second bank spaced apart from the first bank so as to surround the first bank in the plan view; and at least one peripheral line formed below, and intersecting with, the first bank and the second bank, wherein
   the at least one peripheral line includes a plurality of bends provided between the first bank and the second bank in the plan view, and
   the plurality of bends do not overlap with the first bank and the second bank.

2. The display device according to claim 1, wherein the at least one peripheral line further includes a portion shaped into a crank between the first bank and the second bank.

3. The display device according to claim 1, wherein the at least one peripheral line further includes: a trunk; and a branch branching off the trunk, wherein the plurality of bends is at an intersection of the trunk and the branch, and
   the trunk and the branch are provided between the first bank and the second bank in the plan view.

4. The display device according to claim 3, wherein the at least one peripheral line is a plurality of peripheral lines, and
   the plurality of peripheral lines are arranged side-by-side, and the branch of one of the plurality of peripheral lines and the branch of another one of the plurality of peripheral lines are staggered.

5. The display device according to claim 1, further comprising:
   an inter-bank insulating film provided between the first bank and the second bank, the inter-bank insulating film covering the at least one peripheral line,
   wherein a thickness of the inter-bank insulating film is less than a thickness of the first bank.

6. The display device according to claim 5, wherein the inter-bank insulating film is made of resin, formed between the first bank and the second bank, and covers the at least one peripheral line without any gap, and the thickness of the inter-bank insulating film is less than a thickness of the second bank.

7. The display device according to claim 5, wherein each of the first bank and the second bank is shaped into a frame, and has a corner with a curvature, and the inter-bank insulating film is provided between the corners of the first bank and the second bank in the plan view.

8. The display device according to claim 1, further comprising:
a first inorganic sealing film covering the first bank and the second bank; an organic sealing film provided above the first inorganic sealing film; and a second inorganic sealing film covering the organic sealing film.

9. The display device according to claim 1, wherein
each of the first bank and the second bank is shaped into a frame, and has a corner with a curvature, and
the plurality of bends is between the corners of the first bank and the second bank in the plan view.

10. The display device according to claim 1, further comprising:
a plurality of thin film transistors (TFTs); and a planarization film provided above the plurality of TFTs and below the plurality of light-emitting devices, wherein
the at least one peripheral line is formed either (i) between a gate electrode layer of the plurality of TFTs and the planarization film, or (ii) in the gate electrode layer.

11. The display device according to claim 10, wherein
each of the first bank and the second bank is at least partially formed in the same layer as the planarization film.

12. The display device according to claim 1, wherein
a shape of the first bank is band-like in the plan view, and an edge of the first bank on a display side of the display device surrounds the display region.

13. A display device comprising: a display region including a plurality of light-emitting devices; a first bank spaced apart from the display region so as to surround the display region in a plan view; a second bank spaced apart from the first bank so as to surround the first bank in the plan view; and a plurality of peripheral lines formed below, and intersecting with, the first bank and the second bank, wherein
each of the plurality of peripheral lines includes a plurality of bends provided in an area between the first bank and the second bank in the plan view, and
the plurality of bends do not overlap with the first bank and the second bank.

14. The display device according to claim 13, wherein
a shape of the first bank is band-like in the plan view, and an edge of the first bank on a display side of the display device surrounds the display region.

* * * * *